United States Patent
Deshpande et al.

(10) Patent No.: US 7,907,432 B2
(45) Date of Patent: Mar. 15, 2011

(54) CONTENT ADDRESSABLE MEMORY DEVICE FOR SIMULTANEOUSLY SEARCHING MULTIPLE FLOWS

(75) Inventors: Chetan Deshpande, San Jose, CA (US); Sandeep Khanna, Los Altos, CA (US); Varadarajan Srinivasan, Los Altos Hills, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 135 days.

(21) Appl. No.: 12/495,202

(22) Filed: Jun. 30, 2009

(65) Prior Publication Data

US 2010/0328981 A1 Dec. 30, 2010

(51) Int. Cl.
*G11C 15/00* (2006.01)
(52) U.S. Cl. .................. 365/49.1; 365/49.17; 365/49.18
(58) Field of Classification Search .................. 365/49.1, 365/49.17, 49.18
See application file for complete search history.

(56) References Cited

U.S. PATENT DOCUMENTS

| | | | |
|---|---|---|---|
| 5,964,857 | A | 10/1999 | Srinivasan et al. |
| 6,137,707 | A | 10/2000 | Srinivasan et al. |
| 6,324,087 | B1 | 11/2001 | Pereira |
| 6,505,271 | B1 | 1/2003 | Lien et al. |
| 6,687,785 | B1 | 2/2004 | Pereira |
| 6,707,693 | B1 | 3/2004 | Ichiriu |
| 6,718,433 | B1 | 4/2004 | Pereira |
| 6,744,652 | B2 | 6/2004 | Srinivasan et al. |
| 6,763,425 | B1 | 7/2004 | Pereira |
| 6,856,527 | B1 | 2/2005 | Srinivasan et al. |
| 6,901,000 | B1 * | 5/2005 | Ichiriu et al. ............... 365/49.17 |
| 7,219,188 | B1 | 5/2007 | Pereira |
| 7,555,593 | B1 | 6/2009 | Rosman |

FOREIGN PATENT DOCUMENTS

JP 2000-030469 A 1/2000

OTHER PUBLICATIONS

International Searach Report, Written Opinion and Notice of Transmittal of same mailed Sep. 15, 2010 in International Application No. PCT/US2010/039605.

* cited by examiner

*Primary Examiner* — Huan Hoang
*Assistant Examiner* — Jason Lappas
(74) *Attorney, Agent, or Firm* — Mahamedi Paradice Kreisman LLP; William L. Paradice, III

(57) ABSTRACT

A CAM device includes a CAM array coupled to a programmable priority encoding (PPE) logic circuit. The CAM array concurrently compares multiple input data with stored data to generate corresponding match results that are provided to the PPE logic circuit. The PPE logic circuit selectively favors the match results of a selected flow over the match results of the other flows in response to a flow select signal, which can be toggled to alternately select the match results of various flows. In this manner, the match results of the selected flow are generated and output even if the HPM index of the selected flow is of a lower priority than those of the non-selected flows, thereby ensuring an even distribution of match results reporting between different flows.

23 Claims, 7 Drawing Sheets

CONTENT ADDRESSABLE MEMORY DEVICE FOR SIMULTANEOUSLY SEARCHING MULTIPLE FLOWS

TECHNICAL FIELD

The present invention generally to CAM devices and specifically to simultaneously processing multiple flows in a CAM device.

BACKGROUND OF RELATED ART

A content addressable memory (CAM) device is a storage device having an array of memory cells that can be instructed to compare the specific pattern of an input string (e.g., a search key or a comparand word) with data stored in rows of the array. The entire CAM array, or segments thereof, may be searched in parallel for a match with the comparand data. If a match exists, the CAM device indicates the match condition by asserting a match flag, and may indicate the existence of multiple matches by asserting a multiple match flag. The CAM device typically includes a priority encoder that determines the highest priority matching address (e.g., the lowest matching CAM index). The highest priority matching (HPM) address, the contents of the matched location, and other status information (e.g., skip bit, empty bit, full flag, as well as match and multiple match flags) may be output from the CAM device to an output bus. In addition, associative data may be read out from an associated addressable storage device (e.g., DRAM).

To increase bandwidth, it is desirable for CAM devices to handle multiple flows (e.g., different input strings) at the same time. This can be achieved using a CAM array having rows of multi-compare CAM cells that can compare multiple input strings with stored data therein at the same time. For conventional multi-compare CAM arrays, the match results associated with respective multiple compare operations are provided simultaneously to a single priority encoder, which in turn generates the HPM index. Because conventional priority encoders generate the HPM index as a function of priority (e.g., the physical location of the matching data relative to the non-matching data), the output match results of one flow can dominate the output match results of other flows depending upon the arrangement of data stored in the CAM device. For example, if input strings associated with a first flow F1 most frequently match higher-priority CAM data and input strings associated with a second flow F2 most frequently match lower-priority CAM data, then the priority encoder will most frequently report the match results (i.e., the HPM indices) of the first flow F1, even if the second flow F2 also has match conditions during the same compare cycle. In this case, the match results of the first flow F1 override the match results of the second flow F2, thereby unfairly rendering the accuracy of the second flow's match results subject to the match results of the first flow. Indeed, the preferential reporting of match results for one flow over the match results of other flows is not acceptable in multi-flow search systems for which multiple flows are deemed to be equally important (e.g., such as those currently employed in QoS functions, regular expression searching, intrusion detection, and so on).

The problem of under-reporting the match results of some flows in favor of the match results of another flow can be addressed by providing a separate priority encoder for each flow to be simultaneously compared in the CAM device. However, because priority encoders are complex logic circuits having a number of hierarchical levels of logic gates, providing a separate priority encoder for each flow in a multi-flow CAM device would dramatically increase the size and power consumption of the CAM device.

Thus, there is a need for a flow-sensitive priority encoding scheme for a CAM device that ensures an even distribution of match results between multiple flows without requiring a separate priority encoder for each flow.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

Figure 1:
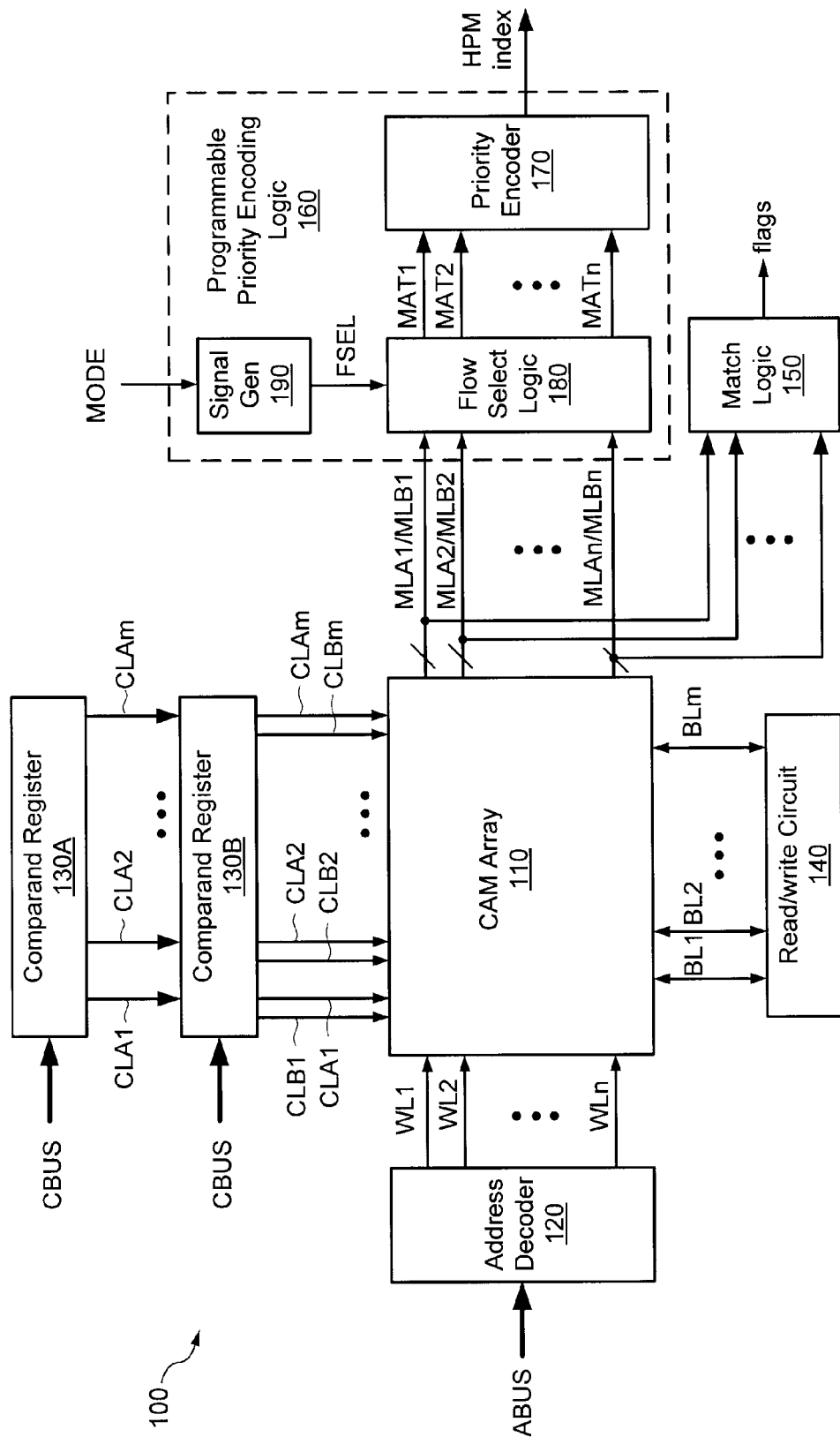
FIG. 1 shows a functional block diagram of a content addressable memory (CAM) device in accordance with some of the present embodiments.

A method and apparatus for handling multiple search operations in a CAM device at the same time are disclosed. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Embodiments of the present invention allow multiple input flows (e.g., multiple search keys) to be processed at the same time using a programmable priority encoding scheme that ensures the match results of each flow are generated (e.g., and reported to a user) evenly with respect to one another regardless of the physical location of the matching entries associated with each flow. In accordance with present embodiments, the CAM device includes a CAM array coupled to a programmable priority encoding (PPE) logic circuit. The CAM array includes a plurality of multi-compare CAM cells that each can compare different input data associated with a plurality of separate input flows with data stored therein at the same time to generate corresponding match results, which are concurrently provided to the PPE logic circuit. The PPE logic circuit receives the match results from the CAM array, and selectively favors the match results of any one flow over the match results of the other flows in response to a flow select signal (FSEL). The state of the FSEL signal can be toggled to alternately select the match results of one flow over one or more other flows for successive compare operations. In this manner, the match results of the selected flow are generated and output even if the HPM index of the selected flow is of a lower priority than those of the non-selected flows, thereby ensuring an even distribution of match results reporting between different flows regardless of the priorities of the matching locations.

More specifically, for some embodiments, the PPE logic circuit includes flow select logic and a priority encoder. The flow select logic includes a plurality of first match inputs to receive the first match results from all of the rows of the CAM array, a plurality of second match inputs to receive the second match results from all of the rows of the CAM array, a control input to receive the FSEL signal, and a plurality of outputs. The priority encoder, which for some embodiments can be a conventional priority encoder, includes a plurality of inputs coupled to corresponding outputs of the flow select logic, and include an output to generate an index of a highest priority match in response to the match results. The flow select logic selectively forwards either the first match results or the second match results to the priority encoder in response to the FSEL signal.

For one embodiment, when the flow select signal is in a first state, the flow select logic forwards the first match results to the priority encoder if at least one of the first match results indicates a match condition, and forwards the second match results to the priority encoder if none of the first match results indicates a match condition. Similarly, when the flow select signal is in a second state, the flow select logic forwards the second match results to the priority encoder if at least one of the second match results indicates a match condition, and forwards the first match results to the priority encoder if none of the second match results indicates a match condition. In this manner, throughput of the CAM device is maximized by reporting the match results of the non-selected flow if the selected flow does not have any match results.

FIG. 1 shows a CAM device 100 in accordance with some of the present embodiments. CAM device 100 includes a CAM array 110, an address decoder 120, first and second comparand registers 130A and 130B, a read/write circuit 140, match logic 150, and programmable priority encoding (PPE) logic 160. One or more instructions and related control signals can be provided to CAM device 100 from an instruction decoder (not shown for simplicity) to control read, write, compare, initialization, and other operations for CAM device 100. Other well-known signals that can be provided to CAM device 100, such as enable signals, clock signals, and power connections, are not shown for simplicity.

CAM array 110 includes a plurality of rows, each row including any number of multi-compare CAM cells (not shown in FIG. 1 for simplicity) for storing a corresponding CAM word. Each row of CAM cells in array 110 is coupled to address decoder 120 via a corresponding word line WL, and is also coupled to PPE logic 160 and to match logic 150 via first and second corresponding match lines MLA and MLB. Further, although not shown in FIG. 1, each row of CAM cells in CAM array 110 can include one or more validity bits to indicate whether the corresponding row (or any segment thereof) of CAM cells stores valid data. In addition, for some embodiments, CAM device 100 includes a well-known match latch circuit (not shown for simplicity) coupled between the match lines ML and PPE logic 160 to latch match results generated in CAM array 110 during compare operations.

For some embodiments, the rows in CAM array 110 may be divided into a plurality of row segments, for example, to reduce the capacitive loading for each row and/or to provide multiple width/depth configurations for the array. For one embodiment, the segmented rows of CAM array 110 may be programmed to operate in various width and depth configurations to accommodate CAM words of varying lengths as described, for example, in U.S. Pat. No. 6,243,281, which is assigned to the assignee of the present disclosure and incorporated herein by reference.

Further, although not shown in FIG. 1 for simplicity, CAM array 110 may include one or rows of redundant CAM cells that can be enabled to functionally replace defective rows of CAM cells in CAM array 110 as described, for example, in U.S. Pat. No. 6,275,426, in U.S. Pat. No. 6,249,467, and/or in U.S. Pat. No. 6,865,098, all of which are incorporated by reference herein.

The columns of CAM cells in CAM array 110 are coupled to first comparand register 130A via a first set of comparand lines CLA and to second comparand register 130B via a second set of comparand lines CLB, and are coupled to read/write circuit 140 via bit lines BL. Comparand register 130A is well-known, and is configured to provide a first search key (e.g., a first comparand word) received from a comparand bus (CBUS) to CAM array 110 for compare operations with CAM words stored therein via first comparand lines CLA. Similarly, comparand register 130B is well-known, and is configured to provide a second search key (e.g., a second comparand word) received from CBUS to CAM array 110 for compare operations with CAM words stored therein via second comparand lines CLB. For another embodiment, search keys can be provided to comparand registers 130A and 130B via separate buses. For other embodiments, the search key can be provided to CAM array 110 via another bus and/or circuit.

Read/write circuit 140 includes well-known write drivers to write CAM words received from a data bus (DBUS) to CAM array 110 via bit lines BL, and includes well-known sense amplifiers to read CAM words from CAM array 110 via bit lines BL onto DBUS. For other embodiments, read/write circuit 140 may be coupled to a bus other than DBUS.

Address decoder 120 is well-known, and includes circuitry to select corresponding rows in CAM array 110 for read, write, and/or other operations in response to an address received from an address bus (ABUS) using the word lines WL. For other embodiments, addresses may be provided to address decoder 120 from another suitable bus and/or circuitry.

The first match lines MLA provide match results for compare operations between the first search key (SK_A) provided by first comparand register 130A and CAM words stored in CAM array 110 to PPE logic 160 and to match logic 150, and the second match lines MLB provide match results for compare operations between the second search key (SK_B) provided by second comparand register 130B and CAM words stored in CAM array 110 to PPE logic 160 and to match logic 150. For some embodiments described herein, CAM array 110 compares the first and second search keys with data stored therein at the same time to generate the first and second match results on MLA and MLB, respectively, at the same time.

Match logic 150, which is well-known, uses the match results indicated on the match lines to generate a match flag indicative of a match condition in CAM array 110. If there is more than one matching entry in CAM array 110, match logic 150 may generate a multiple match flag to indicate a multiple match condition. In addition, match logic 150 may use the validity bits from CAM array 110 to assert a full flag when all of the rows of CAM cells in CAM array 110 are filled with valid entries.

In response to the match results output from CAM array 110, PPE logic 160 determines the matching entry that has the highest priority number associated with it and generates the index or address of this highest priority match (HPM). In addition, PPE logic 160 can use the validity bits (not shown in FIG. 1) from CAM array 110 to generate the next free address (NFA) that is available in CAM array 110 for storing new data. For some embodiments, the NFA is provided as an input address to address decoder 120.

More specifically, PPE logic 160 is shown in FIG. 1 as including a priority encoder 170, flow select logic 180, and a programmable signal generator 190, and has a number of inputs to receive match results from CAM array 110 via the first and second sets of match lines MLA and MLB, an output to generate the HPM index, and a control input to receive a mode signal (MODE). Signal generator 190 receives MODE, and in response thereto, generates a flow select signal (FSEL) that is provided to a control input of flow select logic 180. In response to FSEL, flow select logic 180 forwards either the match results on MLA or the match results on MLB (e.g., either the match results of flow A or flow B) to priority encoder 170 via output match lines MAT. In response thereto, priority encoder 170 generates the HPM index in a well-known manner. For some embodiments, priority encoder 170 can be any conventional priority encoder.

Together, priority encoder 170, flow select logic 180, and signal generator 190 ensure that match results output from CAM device 100 are fairly (e.g., evenly) distributed between the first and second flows FA and FB, regardless of the physical locations of the matching entries. More specifically, because conventional priority encoders such as priority encoder 170 generate the HPM index as a function of priority (e.g., physical location of the matching data relative to the non-matching data), the output match results of one flow can dominate the output match results of other flows depending upon the arrangement of data stored in the CAM device, as discussed in the background section of this disclosure. To alleviate this problem, flow select logic 180 selectively forwards either the first match results or the second match results to the priority encoder 170 in response to FSEL. In this manner, signal generator 190 generates FSEL in a manner that causes priority encoder 170 to alternate index generation preference between the first and second input flows FA and FB.

For some embodiments, MODE can be set to any one of a plurality of states to select an HPM index generation mode for the PPE logic 160. For one example, MODE can be set to a first state that causes signal generator 190 to alternate FSEL between first and second flow select states during successive compare operations. More specifically, when FSEL is in the first select state, flow select logic 180 forwards the first match results to priority encoder 170 if at least one of the first match results indicates a match condition, and forwards the second match results to priority encoder 170 if none of the first match results indicates a match condition. Conversely, when FSEL is in the second state, flow select logic 180 forwards the second match results to priority encoder 170 if at least one of the second match results indicates a match condition, and forwards the first match results to priority encoder 170 if none of the second match results indicates a match condition. In this manner, the PPE logic 160 ensures flow fairness by alternately reporting the match results of the first and second flows FA and FB, and maximizes throughput by reporting the match results of the non-selected flow if the selected flow does not have any match conditions.

For another example, MODE can be set to a second state that causes signal generator 190 to alternate FSEL between first and second flow select states every Nth compare operation, where N is a selectable integer. For example, in this mode, if N=3, then PPE logic 160 will generate the match results for the first flow FA for 3 compare operations, then generate the match results for the second flow FB for the next 3 compare operations, then switch back to the first flow FA, and so on.

For another example, MODE can be set to a third state that causes signal generator 190 to selectively alternate the state of FSEL in response to which flows the match results previously generated by priority encoder 170 belong. For example, if the PPE logic 160 previously outputs the match results of the first flow more often than the second flow, then FSEL can be manipulated to select the second flow for subsequent compare operations until the PPE logic 160 has output an equal number of match results from each flow. For an alternate embodiment, the state of FSEL can be selectively toggled in a manner to achieve a predetermined ratio of match result reporting between the first and second flows.

As mentioned above, CAM array 110 compares two search keys with data stored therein at the same time to generate first and second match results concurrently. For some embodiments, each of multi-compare CAM cells in CAM array 110 is a quaternary CAM cell having a pair of memory cells to enable storage of a two-bit data value (hereinafter referred to as quaternary data) that is representative of one of four logic states for the CAM cell: logic '0', logic '1', forced-match (also referred to as a "don't care" state), and forced-mismatch. One or more of the four logic states may be unused in selected embodiments. By providing quaternary data to each of the multiple compare circuits of a multi-compare CAM cell instead of complementary binary data, comparison results may be masked within each CAM cell (i.e., local masking) without requiring additional transistors or other components in the multiple compare circuits or elsewhere in the CAM cell. Consequently, the quaternary, multi-compare CAM cell may be smaller than a multi-compare CAM cell that includes additional circuit components to achieve local masking. Such size reduction is multiplied by the thousands or millions (or more) of CAM cells included within a given CAM device, substantially reducing the die size of the overall CAM device. The reduced die size potentially enables more of the CAM devices to be fabricated on a given semiconductor wafer, reducing the per-device fabrication cost.

Figure 2:
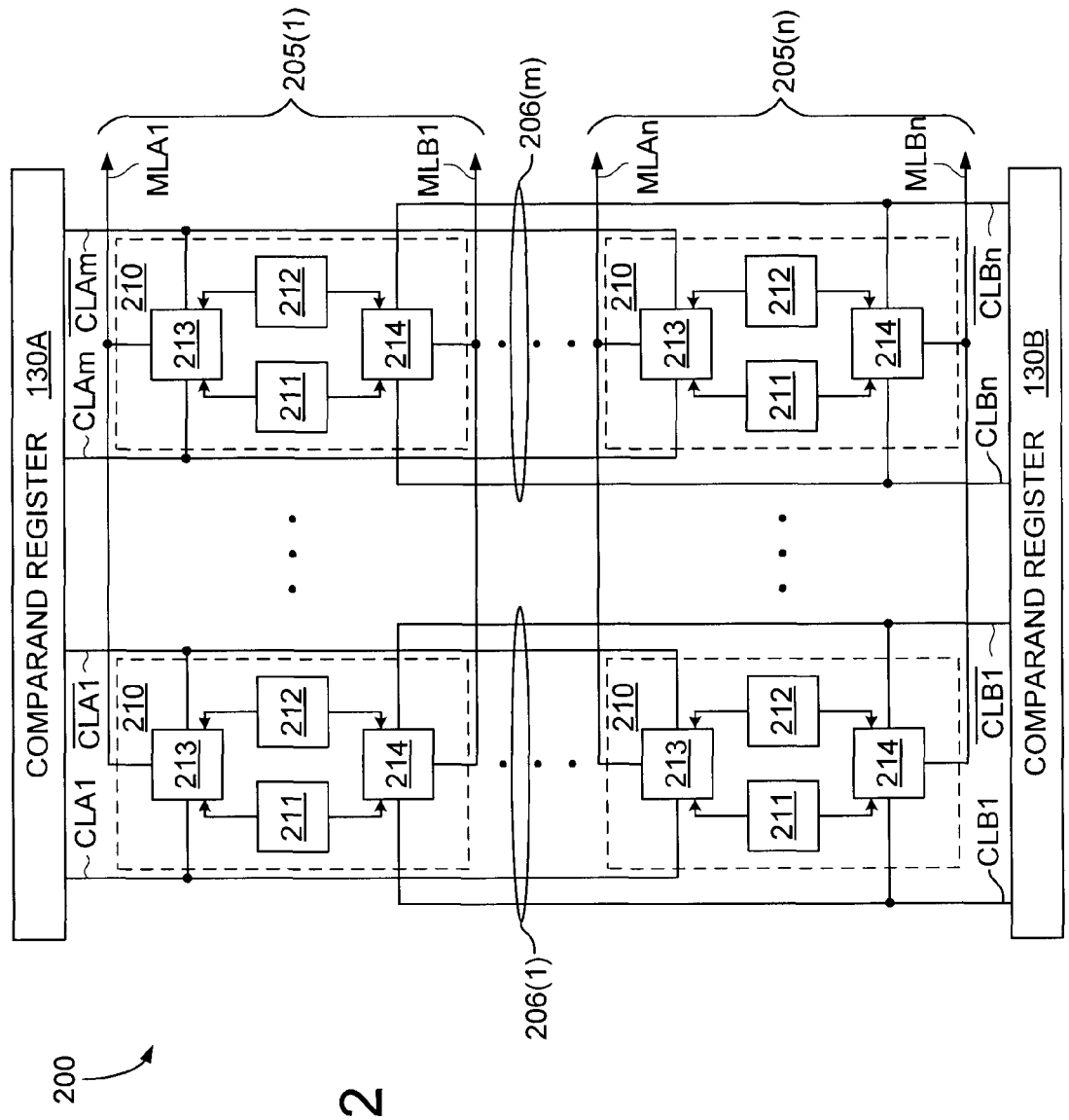
FIG. 2 shows a simplified block diagram of one embodiment of the CAM array of FIG. 1.

FIG. 2 illustrates a CAM array 200 that is one embodiment of CAM array 110 of FIG. 1. CAM array 200 includes an array of multi-compare CAM cells 210 arranged in n rows and m columns (n and m being any integer values, including the same value), a set of n match line pairs 205, and a set of m compare line groups 206. Each row of CAM cells 210 is coupled to a corresponding pair of match lines MLA and MLB. Each column of CAM cells 210 is coupled to first comparand register 130A via a first complementary compare line pair CLA/$\overline{\text{CLA}}$, and is coupled to second comparand register 130B via a second complementary compare line pair CLB/$\overline{\text{CLB}}$. For simplicity, the word lines and bit lines of CAM array 200 are not shown in FIG. 2.

Each CAM cell 210 includes two memory cells 211-212 and two compare circuits 213-214. Each of the compare circuits 213-214 is coupled to receive a data value from each of the memory cells 211-212, is coupled to a respective one of the match lines MLA-MLB that form a match line pair 205, and to a respective one of the compare line pairs CLA/$\overline{\text{CLA}}$ and CLB/$\overline{\text{CLB}}$ that form compare line group 206. More specifically, for each CAM cell 210, the first compare circuit 213 is coupled to receive a first data value from its first memory cell 211 and a second data value from its second memory cell 212, and is coupled to a first match line MLA and to a first compare line pair CLA/$\overline{\text{CLA}}$. The second compare circuit 214 is coupled to receive the first and second data values from memory cells 211 and 212, respectively, and is coupled to second match line MLB and to the second compare line pair CLB/$\overline{\text{CLB}}$. In this manner, each CAM cell 210 is able to simultaneously compare a quaternary data value stored collectively in memory cells 211 and 212 with the first and second search keys to generate first and second match results on MLA and MLB, respectively.

For one embodiment, each of the first compare line pairs CLA/$\overline{\text{CLA}}$ is coupled to first comparand register 130A and provides a pair of complementary compare signals representative of a respective data bit of the first search key to the corresponding column of CAM cells 210. Similarly, each of the second compare line pairs CLA/$\overline{\text{CLB}}$ is coupled to second comparand register 130B and provides a pair of complementary compare signals representative of a respective data bit of the second search key to the corresponding column of CAM cells 210.

For an alternative embodiment, single-ended compare signals may be delivered to the columns of the CAM cells such that two compare lines may be used to form a given compare line group 206, rather than the four compare lines per group shown in FIG. 2. Also, in a pipelined system, a single comparand register may be used to drive signals onto the first and second compare line pairs at different times. In yet other embodiments, the comparand registers may be omitted altogether, with the first and second compare line pairs being driven directly (and either simultaneously or in time-multiplexed fashion) by comparand data signals received via an external interface. Although the compare signals present on a compare line pair are generally referred to herein as being complementary comparand signals, both compare lines of a compare line pair may be driven to the same logic state (e.g., logic low or high), for example, to mask compare operations within an entire column of the CAM array 200.

Still referring to FIG. 2, the memory cells 211 and 212 may be any type of volatile or non-volatile memory cell including, without limitation, static random access memory (SRAM) cells, negative-differential-resistor (NDR) devices, dynamic random access memory (DRAM) cells, programmable read-only memory (PROM) cells, electrically erasable PROM (EEPROM) cells, and flash memory cells. Further, each of the compare circuits 213 and 214 may be any type of compare circuit that can compare the data value stored in memory cells 211 and 212 with the comparand data delivered via the corresponding compare line pair.

Each CAM cell 210 can be extended to perform as many simultaneous compare operations as are required by a CAM device incorporating CAM array 200 by including additional compare circuits, compare lines, and match lines. For example, three simultaneous compare operations can be performed by adding a third match line coupled to a third compare circuit (not shown for simplicity) in each CAM cell 210. As with compare circuits 213 and 214, the third compare circuit is coupled to receive data from each of the memory cells 211 and 212, and may be coupled to receive third comparand data from a third comparand register via a third set of compare lines.

Figure 3:
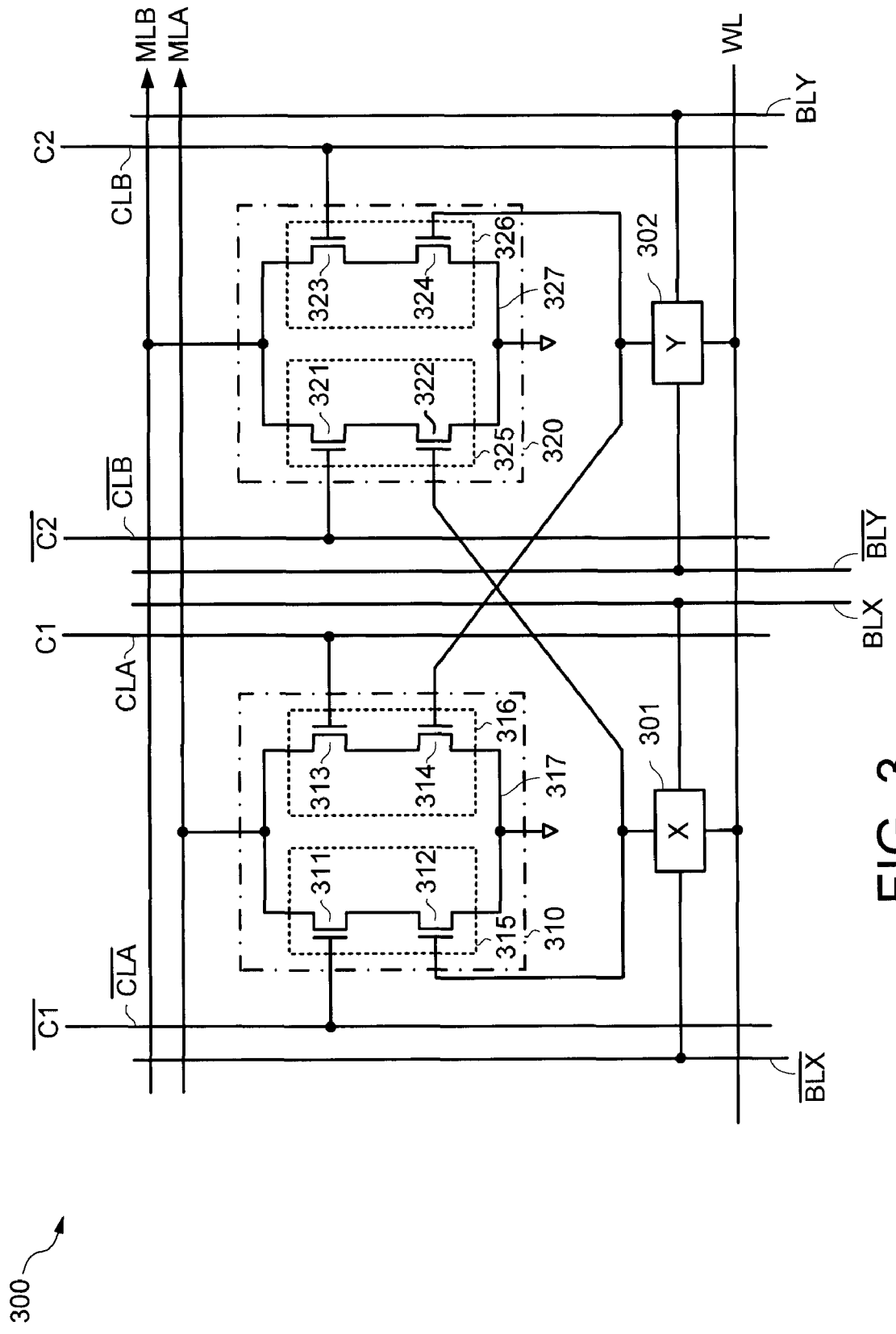
FIG. 3 illustrates one embodiment of the CAM cells of FIG. 2.

FIG. 3 illustrates a multi-compare CAM cell 300 that is one embodiment of the CAM cell 210 of FIG. 2. The CAM cell 300 includes a pair of memory cells 301 and 302 to store the constituent bits, X and Y, respectively, of a quaternary data value, and which are referred to herein as the X-cell 301 and the Y-cell 302. A word line WL is coupled to the X-cell 301 and Y-cell 302 and, when activated, enables read/write access to the X- and Y-cells through respective bit line pairs BLX/$\overline{\text{BLX}}$ and BLY/$\overline{\text{BLY}}$ (referred to herein as the X-bit lines and Y-bit lines, respectively). A First and second match lines MLA and MLB are coupled to the CAM cell 300 and used to indicate the results of compare operations within the CAM cell. In the embodiment of FIG. 3, each of the match lines MLA and MLB is initially pre-charged to a logic high level (e.g., via pre-charge or pull-up circuits, not shown), and is then discharged by the CAM cell 300 (i.e., pulled down to a logic low level) to indicate a mismatch. If no mismatch is detected by CAM cell 300 (or other CAM cells 300 coupled to the match line), the match line (MLA or MLB) remains at the logic high level to indicate a match. Other match line configurations and match signal states may be used in alternative embodiments, as discussed below.

CAM cell 300 also includes two compare circuits 310 and 320. Each compare circuit is coupled to receive the quaternary data value stored in the memory cells 301 and 302, and is coupled to a respective one of match lines MLA and MLB. The compare circuits 310 and 320 are also coupled to respective compare line pairs CLA/$\overline{\text{CLA}}$ and CLB/$\overline{\text{CLB}}$ to receive respective complementary pairs of comparand signals (i.e., C1 and $\overline{\text{C1}}$, and C2 and $\overline{\text{C2}}$). By this arrangement, the CAM cell 300 is able to perform simultaneous or pipelined compare operations in the two compare circuits and therefore constitutes a dual-compare CAM cell. Additional compare circuits (coupled to additional match lines and compare line pairs) may be provided in alternative embodiments of the CAM cell 300 to enable more than two simultaneous comparisons or more than two pipelined compare operations.

Still referring to FIG. 3, compare circuit 310 includes a pair of compare sub-circuits 315/316 coupled in parallel with one another between reference node 317 (a ground node in this example, though other reference voltages may be used) and MLA, and compare circuit 320 similarly includes a pair of compare sub-circuits 325/326 coupled in parallel with one another between reference voltage node 327 and match line MLB. Referring specifically to compare circuit 310, sub-circuit 315 includes transistors 311 and 312 coupled in series between match line MLA and reference node 317, and sub-circuit 316 includes transistors 313 and 314 coupled in series between match line MLA and reference node 317. In compare circuit 320, sub-circuit 325 includes transistors 321 and 322 coupled in series between match line MLB and reference node 327, and sub-circuit 326 includes transistors 323 and 324 also coupled in series between match line MLB and the reference node 327. Control terminals of transistors 312 and 322 (i.e., MOS transistor gates in this example) are coupled to X-cell 301 and therefore are switched on or off according to the state of the X-bit of a quaternary data value, and control terminals of transistors 314 and 324 are coupled to Y-cell 302 and are therefore switched on or off according to the state of the Y-bit of the quaternary data value. Transistors 313 and 311 are coupled to compare lines CLA and $\overline{\text{CLA}}$, respectively and are therefore switched on or off according to the state of comparand signals C1 and $\overline{\text{C1}}$ presented on the compare line pair CLA and $\overline{\text{CLA}}$. Transistors 323 and 321 are similarly coupled to compare lines 400 and 402, respectively, and are therefore switched on or off according to the state of comparand signals C2 and $\overline{\text{C2}}$ presented on the compare line pair CLB and $\overline{\text{CLB}}$.

Figures 4, 5:
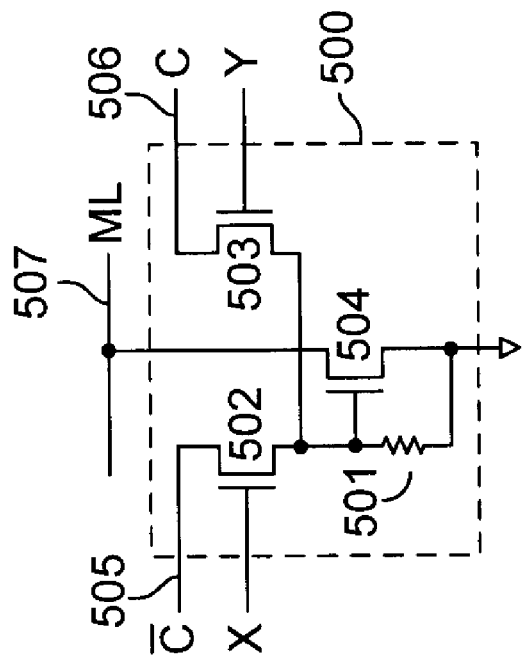
FIG. 4 illustrates an exemplary encoding of data and mask bits (D and M) into constituent X and Y bits of a quaternary data value that may be stored in the CAM cell of FIG. 3.
FIG. 5 shows a circuit diagram of one embodiment of the compare circuit of the CAM cell of FIG. 3.

FIG. 4 illustrates an exemplary encoding of data and mask bits (D and M) into constituent X and Y bits of a quaternary data value that may be stored in the X- and Y-cells 301 and 302 of FIG. 3. In traditional ternary CAM devices, data bits and mask bits are stored within each CAM cell. Data bits are compared with incoming comparand data, and mask bits, when set to a mask state, are used to prevent mismatch conditions (i.e., mismatch between data bit and comparand signal) from being signaled on a match line. In the encoding example of FIG. 4, when the mask bit M is a logic '0' (i.e., a non-masking state), the X bit has the same state as the data bit D and the Y bit is the complement of the X bit. That is, if M=0, then X=D and Y=$\overline{X}$=$\overline{D}$. By contrast, if the mask bit is a logic '1', indicating that any mismatch detected within the CAM cell is to be masked, then both the X and Y bits are set to zero, regardless of the state of the data bit. For the encoding of FIG. 4, the quaternary data value is said to be in a logic '0' state when XY=01 (i.e., X=D=0 and Y=$\overline{D}$=1); a logic '1' state when XY=10 (i.e., X=D=1, Y=$\overline{D}$=0); and a forced-match state when XY=00 (i.e., M=1 and D=0 or 1). This encoding simplifies to the Boolean expressions: X=D*$\overline{M}$ and Y=$\overline{D}$*$\overline{M}$, where the "*" symbol denotes a logic AND function. Note that a forced-mismatch state (XY=11) may also be stored in the CAM cell 300 to force a mismatch indication. Forced-mismatch operation and storage of the forced-mismatch state is discussed below.

Referring again to FIG. 3, and to compare circuit 310 in particular, it can be seen that if the quaternary data value stored in the X- and Y-cells is in a logic '0' or logic '1' state (i.e., XY=01 or XY=10), and the comparand value C1 is in the opposite state, then one or the other of sub-circuits 315 and 316 will establish a path between match line MLA and reference node 317 to indicate the mismatch condition. For example, if the quaternary data value is a logic '0' (XY=01) and C1 is a logic '1', then transistor 314 will be switched on by the '1' stored in Y-cell 302, and transistor 313 will be switched on by the high state of C1, thereby establishing a path between match line MLA and reference node 317 to indicate the mismatch condition. Conversely, if the quaternary data value is a logic '1' (XY=10), and C1 is a logic '0', then transistor 312 will be switched on by the '1' stored in the X-cell 301, and transistor 311 will be switched on by the high state of $\overline{C1}$, thereby establishing a path between match line MLA and reference node 317 to signal the mismatch condition.

If the quaternary data value has the same state as C1, then at least one transistor in each of the sub-circuits 315 and 316 will be switched off. That is, if the quaternary data value matches the comparand value, neither of the sub-circuits 315 and 316 will establish a path between the match line MLA and reference node 317 to indicate a match condition. Similarly, if the quaternary data value is in the forced-match state (XY=00), both of the sub-circuits 315 and 316 are switched to a non-conducting state (i.e., because transistors 312 and 314 are switched off) regardless of the state of C1, preventing either of the sub-circuits 315 and 316 from establishing a path between the match line MLA and reference node 317 and thereby forcing the compare circuit 310 to signal a match condition. If the quaternary data value is in a forced-mismatch state (XY=11), then at least one of the sub-circuits 315 and 316 is ensured to be switched to a conducting state in response to a differential comparand signal on compare lines 396 and 398, thereby forcing the compare circuit 310 to signal a mismatch condition regardless of the state of C1. As discussed below, the forced-mismatch data state may be used for any number of purposes (e.g., testing the CAM array and match detection logic, selectively invalidating rows of the CAM array, etc.).

FIG. 5 shows one embodiment of a compare circuit 500 that may be used in place of one or both of the compare circuits 310 and 320 within the CAM cell of FIG. 3. The compare circuit 500 includes three transistors 502, 503 and 504, with transistor 504 being coupled between match line ML and a reference voltage (ground in this example) and having a gate terminal coupled to source terminals of transistors 502 and 503. Drain terminals of transistors 502 and 503 are coupled to compare lines 505 and 506, respectively, and gate terminals of transistors 502 and 503 are coupled to receive the X bit and Y bit, respectively, of a quaternary data value. If the quaternary data value XY does not match a differential comparand value (C and $\overline{C}$) presented on compare lines 506 and 505, then either X=1 and $\overline{C}$=1, or Y=1 and C=1. In the first mismatch case (X=1, $\overline{C}$=1), transistor 502 is switched on by the high X bit so that the high state of the complement comparand signal $\overline{C}$ propagates to the gate of transistor 504, switching transistor 504 on and thereby establishing a path between the match line 507 and ground to signal the mismatch. In the second mismatch case (Y=1, C=1), transistor 503 is switched on by the high Y bit so that the high state of the comparand signal C propagates to the gate of transistor 504, switching transistor 504 on to signal the mismatch condition. If the quaternary data value does not match the differential comparand value, then a logic low signal is applied to the drain terminal of whichever of transistors 502 and 503 is switched on by the quaternary data value. Consequently, the transistor 504 will not be switched on to establish a path between match line 507 and ground, (i.e., the compare circuit 500 will effectively signal a match condition). For an alternative embodiment, the data and comparand inputs may be swapped by applying the X and Y bits of the quaternary data value to the drain nodes of the transistors 502 and 503, and applying the complementary comparand signals to the gate nodes of the transistors 502 and 503.

Still referring to FIG. 5, when the quaternary data value is in the forced-match state (XY=00), both transistors 502 and 503 are switched off, isolating the gate of transistor 504. Consequently, transistor 504 will not be switched on and therefore will not establish a path between match line 507 and ground. Thus, when the quaternary data value is in the forced-match state, a match condition is indicated by the compare circuit 500, regardless of the state of the comparand data. Conversely, when the quaternary data value is in the forced-mismatch state (XY=11), both transistors 502 and 503 are switched on, thereby ensuring that transistor 504 will be switched on to establish a path between match line 507 and ground (signaling a mismatch) for any complementary pair of signals on compare lines 505 and 506. Note that a resistive element 501, such as a bleed resistor or similar structure, may be coupled between the gate of transistor 504 and ground to prevent the gate of transistor 504 from floating when transistors 502 and 503 are switched off.

For a more detailed description of quaternary CAM cells, refer to U.S. Pat. No. 6,856,527, which is assigned to the assignee of the present disclosure and incorporated by reference herein.

Figure 6:
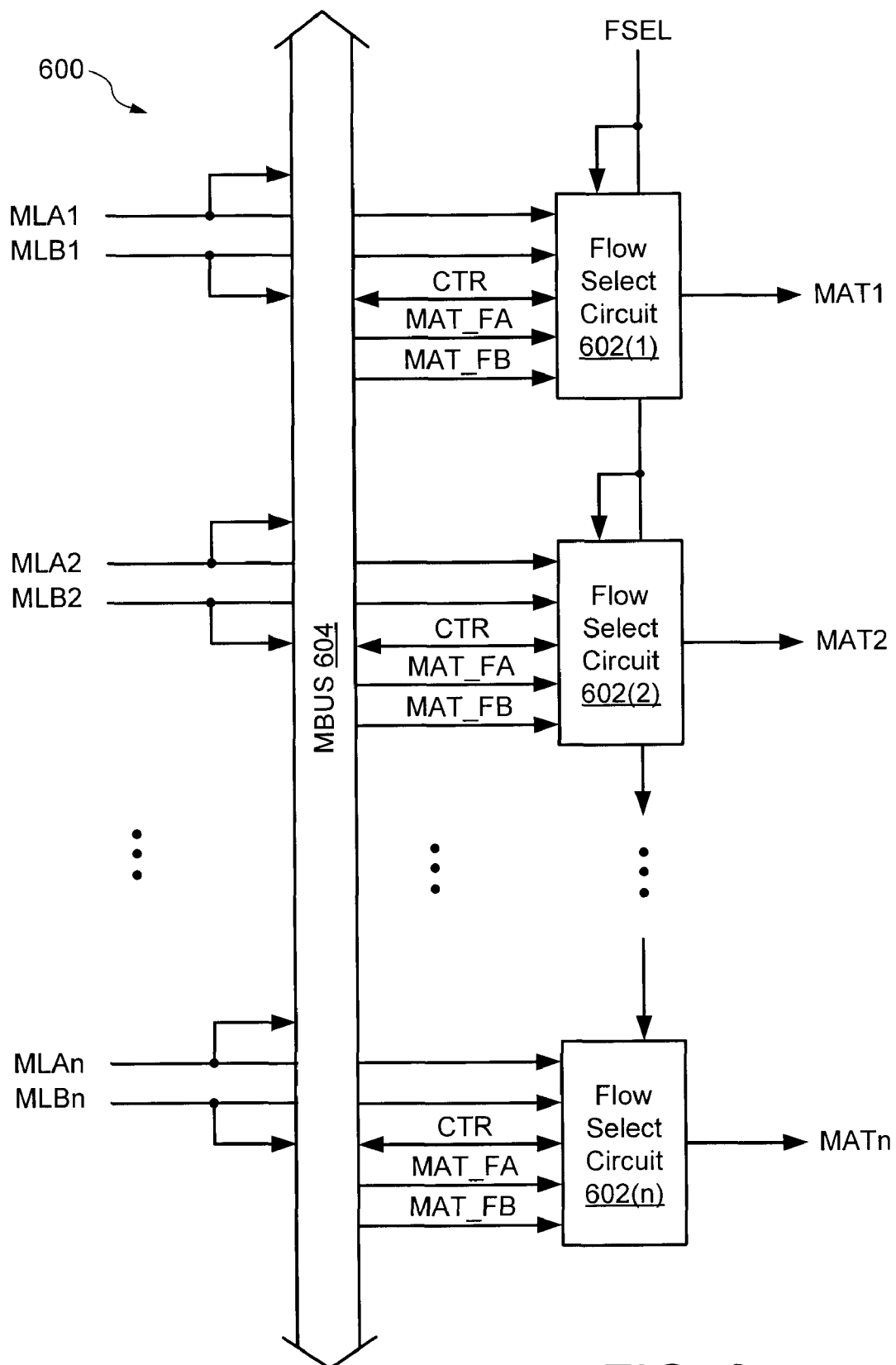
FIG. 6 shows a functional block diagram of one embodiment of the flow select logic of the CAM device of FIG. 1.

FIG. 6 shows a flow select logic 600 that is one embodiment of flow select logic 180 of FIG. 1. Flow select logic 600 includes a plurality of flow select circuits 602(1)-602(n) and a match bus (MBUS) 604. MBUS 604, which extends across all rows of the CAM array 110 (not shown in FIG. 6 for simplicity), includes inputs coupled to the match lines MLA and MLB of each row, and includes outputs coupled to first inputs of each flow select circuit 602. Each flow select circuit 602 includes second inputs coupled to the match lines MLA and MLB for the corresponding CAM row, includes a control input to receive the flow select signal FSEL, and includes an output coupled to a corresponding input of priority encoder 170 (not shown in FIG. 6 for simplicity).

Referring also to FIG. 1, during compare operations, first and second search keys are concurrently compared with data stored in CAM array 110 to generate first and second match results on MLA and MLB, respectively. The first and second match results for each CAM row are provided to MBUS 604 and to a corresponding flow select circuit 602 via MLA and MLB, respectively. In response to the first match results on MLA1-MLAn, MBUS 604 provides to all flow select circuits 602 a first flow match signal MAT_FA indicating whether the first flow FA has a match. Similarly, in response to the second match results on MLB1-MLBn, MBUS 604 provides to all flow select circuits 602 a second flow match signal MAT_FB indicating whether the second flow FB has a match. Then, in response to the flow select signal (FSEL) and the flow match signals (MAT_FA and MAT_FB), the flow select circuits 602 determine whether to forward the first match results or the second match results to the priority encoder 170.

For example, assuming that FSEL is toggled between states (e.g., by signal generator 190) to select flows FA and FB for alternate compare operation cycles, the flow select circuits 602 forward the match results of the selected flow to priority encoder 170 if the selected flow has a match condition, and otherwise forward the match results of the non-selected flow to priority encoder 170. More specifically, when FSEL is in the first state to select the first flow FA, flow select circuits 602 forward the first match results to priority encoder 170 if at least one of the first match results indicates a match condition, and forward the second match results to priority encoder 170 if none of the first match results indicates a match condition. Conversely, when FSEL is in the second state to select the second flow FB, flow select circuits 602 forward the second match results to priority encoder 170 if at least one of the second match results indicates a match condition, and forward the first match results to priority encoder 170 if none of the second match results indicates a match condition. In this manner, the flow select logic 600 ensures flow fairness by alternately reporting the match results of the first and second flows FA and FB, and maximizes throughput by reporting the match results of the non-selected flow if the selected flow does not have any match conditions.

Also note that each flow select circuit 602 is coupled to the MBUS 604 via a bidirectional signal line to facilitate the exchange of control information CTR between MBUS 604 and the flow select circuits 602(1)-602(n).

For other embodiments, MBUS 604 can be eliminated, which causes the flow select circuits 602 to forward only the match results of the selected flow to priority encoder 170.

Figure 7:
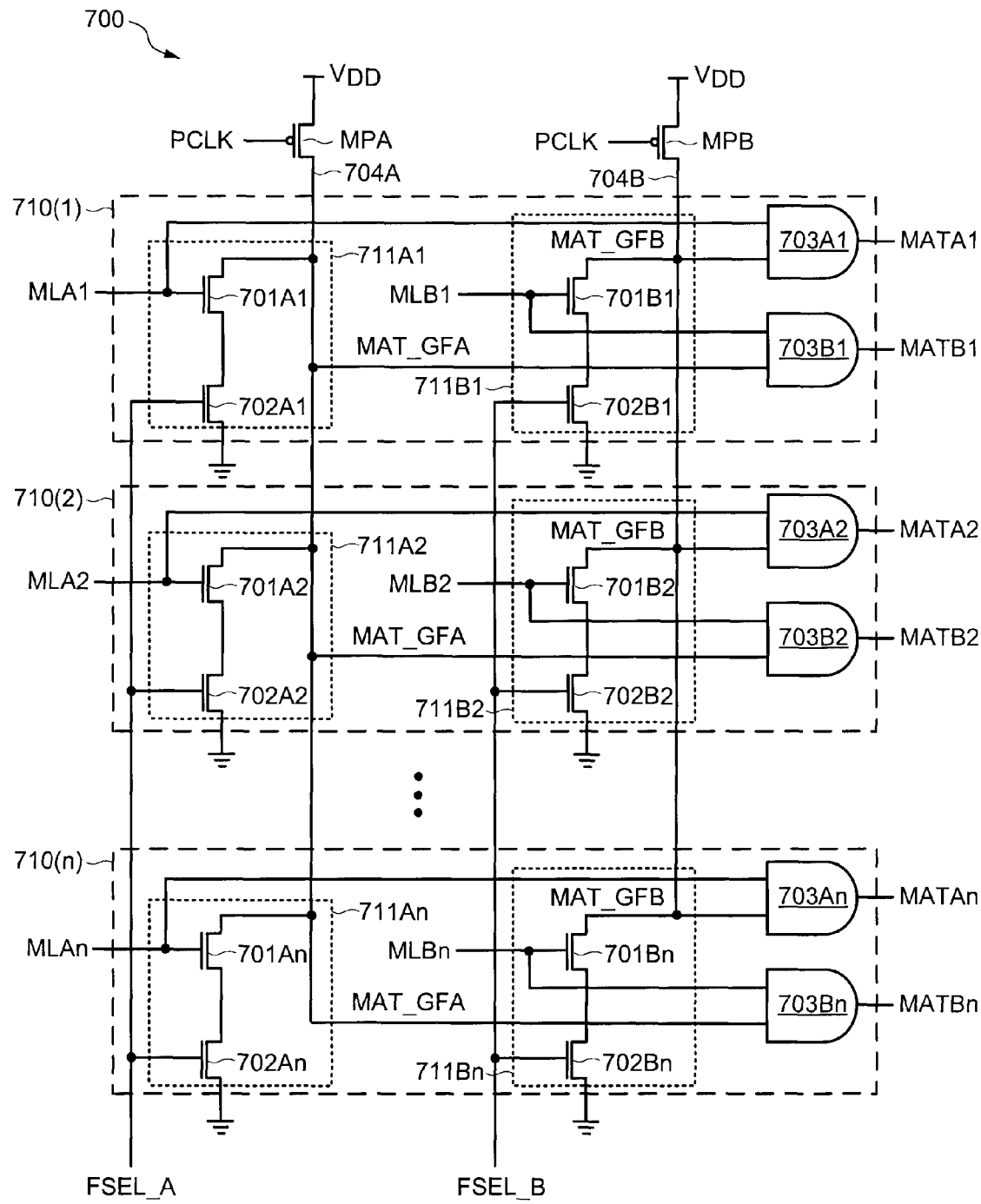
FIG. 7 shows a circuit diagram of one embodiment of the flow select logic of FIG. 6.

FIG. 7 shows a flow select logic 700 that is one embodiment of flow select circuit 600 of FIG. 6. Flow select logic 700 includes flow match lines 704A and 704B and flow select circuits 710(1)-710(n). Flow match lines 704A and 704B, which together form one embodiment of MBUS 604 of FIG. 6, extend across all rows of the CAM array (not shown for simplicity in FIG. 7) and are coupled to a supply voltage $V_{DD}$ via pre-charge transistors MPA and MPB, respectively. The FSEL signal of FIG. 6 is represented as two separate flow select signals FSEL_A and FSEL_B in the exemplary embodiment of FIG. 6, in which FSEL_A and FSEL_B together generate a differential flow select signal that selects one of the flows FA and FB for preferential match reporting. Thus, for example, to select the first flow FA, FSEL_A is asserted (e.g., to logic high) and FSEL_B is de-asserted (e.g., to logic low). Conversely, to select the second flow FB, FSEL_A is de-asserted (e.g., to logic low) and FSEL_B is asserted (e.g., to logic high).

Flow select circuits 710(1)-710(n) are one embodiment of flow select circuits 602 of FIG. 6. Each flow select circuit 710 is coupled to the row match lines MLA and MLB of a corresponding CAM row, to the flow select signals FSEL_A and FSEL_B, and to priority encoder 170 (not shown for simplicity in FIG. 7) via a corresponding match line MAT. More specifically, each flow select circuit 710 includes a first pull-down gate 711A, a second pull-down gate 711B, a first AND gate 703A, and a second AND gate 703B. The first pull-down gate 711A is formed by a series connection of NMOS pull-down transistors 701A and 702A between the first flow match line 704A and ground potential, with the gate of transistor 701A coupled to the first match line MLA of the corresponding CAM row and the gate of transistor 702A coupled to the first flow select signal FSEL_A. The second pull-down gate 711B is formed by a series connection of NMOS pull-down transistors 701B and 702B between second flow match line 704B and ground potential, with the gate of transistor 701B coupled to the second match line MLB of the corresponding CAM row and the gate of transistor 702B coupled to the second flow select signal FSEL_B. The first AND gate 703A includes inputs coupled to the first match line MLA of the corresponding CAM row and to receive a gated flow match signal MAT_GFB from the second flow match line 704B, and includes an output to selectively forward one of the row match results to priority encoder 170 as MATA. The second AND gate 703B includes inputs coupled to the second match line MLB of the corresponding CAM row and to receive a gated flow match signal MAT_GFA from the first flow match line 704A, and includes an output to selectively forward one of the row match results to priority encoder 170 as MATB.

The first pull-down gates 711A ensure that when the first flow FA is selected, the match results of FA are forwarded to priority encoder 170 if there is a match condition for FA. Similarly, the second pull-down gates 711B ensure that when the second flow FB is selected, the match results of FB are forwarded to priority encoder 170 if there is a match condition for FB.

For example, when the first flow FA is selected, FSEL_A is asserted and FSEL_B is de-asserted. The asserted state of FSEL_A turns on transistors 702A1-702An, thereby enabling the first pull-down gates 711A to selectively discharge the first flow match line 704A in response to match results for the first flow FA. The logic low state of FSEL_B turns off transistors 702B1-702Bn, thereby disabling the second pull-down gates 711B from discharging the second flow match line 704B, irrespective of match results for the second flow FB. As a result, the second gated flow match signal MAT_GFB on the second flow match line 704B is maintained in a logic high state, thereby enabling the first AND gates 703A1-703An to forward the first match results on respective match lines MLA1-MLAn to the priority encoder 170 as match signals MATA1-MATAn, respectively.

If there is a match condition for FA, as indicated by a logic high match signal on any of the first match lines MLA1-MLAn, the corresponding NMOS transistor 701A turns on and pulls the first flow match line 704A to a logic low state (e.g., to ground potential). The resulting logic low state of MAT_GFA on flow match line 704A, which indicates a match condition for the first flow FA, forces the outputs of second AND gates 703B1-703Bn to logic low, thereby preventing second AND gates 703B1-703Bn from forwarding the second match results on respective second match lines MLB1-

MLBn to the priority encoder 170 as match signals MATB1-MATBn, respectively. Because the first AND gates 703A1-703An are enabled (e.g., by the logic high state of MAT_GFB), the match results for the first flow FA are forwarded to priority encoder 170 by AND gates 703A as match signals MATA1-MATA.

If there is a not a match condition for FA, as indicated by the absence of a logic high match signal on any of the first match lines MLA1-MLAn, none of NMOS transistors 701A1-701An turns on, and thus the first flow match line 704A remains in its pre-charged logic high state. The resulting logic high state of MAT_GFA on first flow match line 704A, which indicates a mismatch condition for the first flow FA, enables the second AND gates 703B1-703Bn to forward the second match results on respective match lines MLB1-MLBn to the priority encoder 170 as match signals MATB1-MATBn, respectively.

Conversely, when the second flow FB is selected, FSEL_A is de-asserted and FSEL_B is asserted. The asserted state of FSEL_B turns on transistors 702B1-702Bn, thereby enabling the second pull-down gates 711B to selectively discharge the second flow match line 704B in response to match results for the second flow FB. The logic low state of FSEL_A turns off transistors 702A1-702An, thereby disabling the first pull-down gates 711A from discharging the first flow match line 704A, irrespective of match results for the first flow FA. As a result, the first gated flow match signal MAT_GFA on the first flow match line 704A is maintained in a logic high state, thereby enabling the second AND gates 703B1-703Bn to forward the second match results on respective match lines MLB1-MLBn to the priority encoder 170 as match signals MATB1-MATBn, respectively. Thereafter, the flow select logic 700 forwards the second match results to the priority encoder 170 as if there is a match condition for the second flow, in a manner similar to that described above with respect to the selection of the first flow FA.

Figure 8:
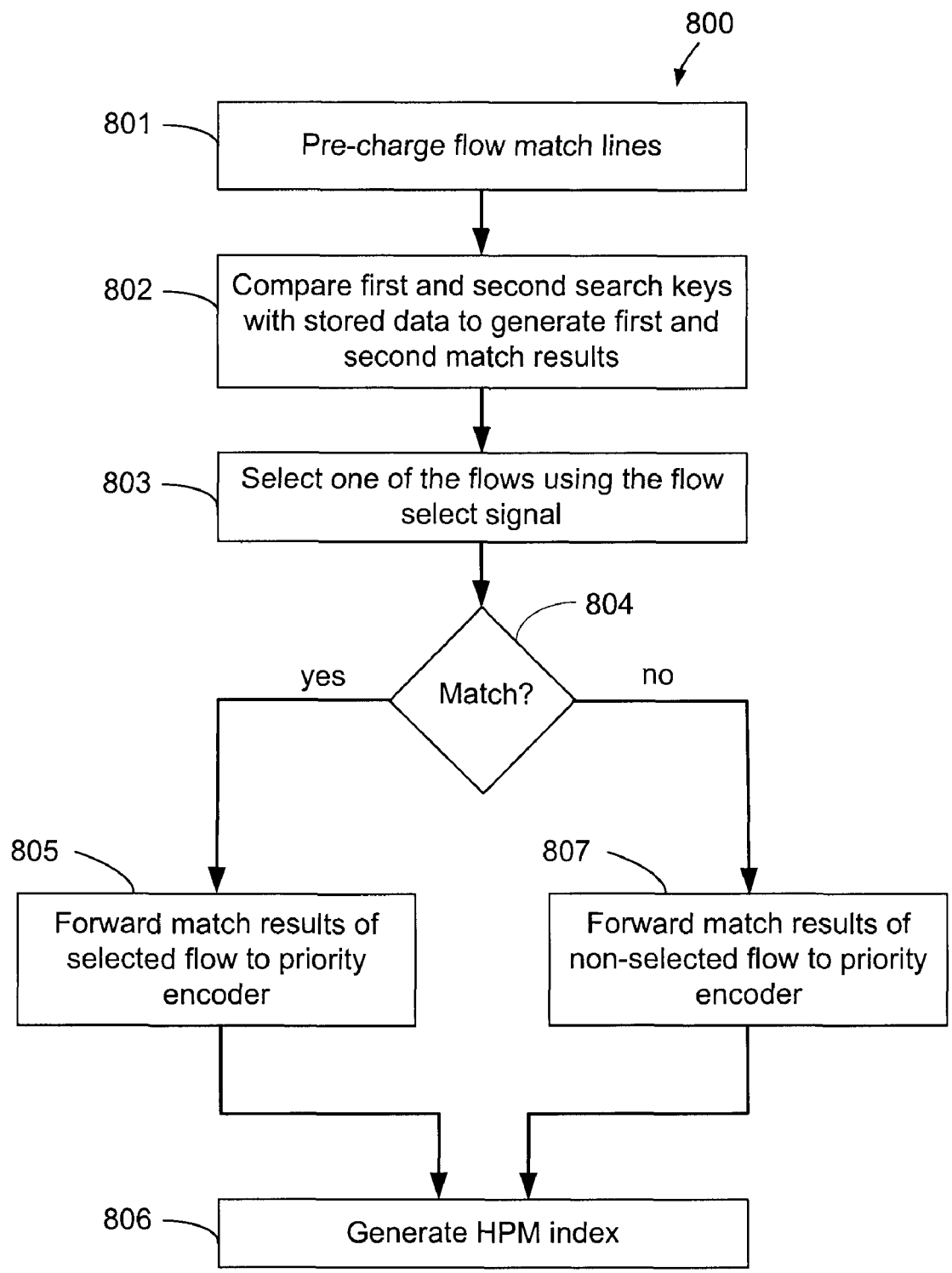
FIG. 8 illustrates an exemplary compare operation for one embodiment of the CAM device of FIG. 1.

An exemplary compare operation is described below with respect to the illustrative flow chart of FIG. 8. Prior to compare operations, a pre-charge clock signal PCLK is asserted (e.g., to logic low) to pre-charge flow match lines 704A and 704B high to $V_{DD}$ via PMOS pre-charge transistors MPA and MPB, respectively (801). Then, during compare operations, the CAM array 110 generates the first and second match results for FA and FB on MLA and MLB, respectively, at the same time (802). Then, the flow select signals FSEL_A and FSEL_B are driven to one of two complementary states to select one of the flows FA or FB (803). Thereafter, if the selected flow has a match condition, as tested at 804, flow select logic 700 forwards the match results of the selected flow to the priority encoder 170 (805), and the priority encoder 170 generates the HPM index (806). Conversely, if the selected flow does not have a match condition, as tested at 804, flow select logic 700 forwards the match results of the non-selected flow to the priority encoder 170 (807), and the priority encoder 170 generates the HPM index (806).

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) that may be used to transfer such formatted data and/or instructions through wireless, optical, or wired signaling media or any combination thereof.

What is claimed is:

1. A content addressable memory (CAM) device configured to process multiple flows, comprising:
   an array including a plurality of rows of CAM cells, each row configured to simultaneously compare first and second search keys with data stored in the row to generate first and second match results, respectively;
   flow select logic having a plurality of first match inputs to receive the first match results from all of the rows, a plurality of second match inputs to receive the second match results from all of the rows, a control input to receive a flow select signal, and a plurality of outputs; and
   a priority encoder having a plurality of inputs coupled to corresponding outputs of the flow select logic, and having an output to generate an index of a highest priority match in response to the match results, wherein when the flow select signal is in a first state, the flow select logic forwards the first match results to the priority encoder only if at least one of the first match results indicates a match condition, and forwards the second match results to the priority encoder if none of the first match results indicates a match condition.

2. The CAM device of claim 1, wherein the flow select logic selectively forwards either the first match results or the second match results to the priority encoder in response to the flow select signal.

3. The CAM device of claim 1, wherein when the flow select signal is in a second state, the flow select logic forwards the second match results to the priority encoder only if at least one of the second match results indicates a match condition, and forwards the first match results to the priority encoder if none of the second match results indicates a match condition.

4. The CAM device of claim 1, wherein the flow select signal alternates between the first and second states for successive compare operations.

5. The CAM device of claim 1, wherein the flow select signal remains in the first state for a predetermined number of compare operations.

6. The CAM device of claim 1, further comprising:
   a match bus coupled to all the rows of the array and configured to simultaneously provide the first and second match results from all the rows to the flow select logic.

7. The CAM device of claim 1, wherein the CAM cells comprise multi-compare CAM cells.

8. The CAM device of claim 7, where each multi-compare CAM cell comprises:
   a first memory cell to store first data;
   a second memory cell to store second data;
   a first compare circuit coupled to a first match line and having a first input coupled to the first memory cell, a plurality of second inputs to receive the first search key, and a third input coupled to the second memory cell; and a second compare circuit coupled to a second match line and having a first input coupled to the first memory cell, a plurality of second inputs to receive the second search key, and a third input coupled to the second memory cell.

9. The CAM device of claim 8, wherein the first and second compare circuits are coupled to first and second comparand data lines to receive the first and second search keys, respectively.

10. The CAM device of claim 8, wherein the first memory cell is coupled to a first pair of bit lines to receive the first data, and wherein the second memory cell is coupled to a second pair of bit lines to receive the second data.

11. A content addressable memory (CAM) device configured to process multiple flows, comprising:

an array including a plurality of rows of CAM cells, each row configured to simultaneously compare first and second search keys with data stored in the row to generate first and second match results, respectively;

flow select logic having a plurality of first match inputs to receive the first match results from all of the rows, a plurality of second match inputs to receive the second match results from all of the rows, a control input to receive a flow select signal, and a plurality of outputs; and a priority encoder having a plurality of inputs coupled to corresponding outputs of the flow select logic, and having an output to generate an index of a highest priority match in response to the match results, wherein the flow select logic comprises:

a match bus extending across all of the rows of the CAM array and coupled to receive the first and second match results; and a plurality of flow select circuits, each having first inputs coupled to the match bus, having second inputs to receive the first and second match results, having a second input to receive the flow select signal, and having outputs coupled to the inputs of the priority encoder.

12. The CAM device of claim 11, wherein the flow select signal comprises first and second flow select signals, each flow select circuit comprises:

a first pull-down gate coupled between a first flow match line and ground potential, having inputs coupled to the first match line of a corresponding CAM row and to the first flow select signal, and having an output to generate a first flow match signal;

a second pull-down gate coupled between a second flow match line and ground potential, having inputs coupled to the second match line of the corresponding CAM row and to the second flow select signal, and having an output to generate a second flow match signal;

a first AND gate having inputs coupled to the first flow match line and the second match line of the corresponding CAM row, and having an output coupled to the priority encoder; and a second AND gate having inputs coupled to the second flow match line and the first match line of the corresponding CAM row, and having an output coupled to the priority encoder.

13. The CAM device of claim 12, wherein the first flow match signal indicates whether the first flow has a match condition, and the second flow match signal indicates whether the second flow has a match condition.

14. The CAM device of claim 11, wherein the flow select logic selectively prefers forwarding either the first match results or the second match results to the priority encoder in response to the flow select signal.

15. The CAM device of claim 11, wherein when the flow select signal selects the first flow, the flow select logic forwards the first match results to the priority encoder if at least one of the first match results indicates a match condition, and forwards the second match results to the priority encoder if none of the first match results indicates a match condition.

16. The CAM device of claim 15, wherein when the flow select signal selects the second flow, the flow select logic forwards the second match results to the priority encoder if at least one of the second match results indicates a match condition, and forwards the first match results to the priority encoder if none of the second match results indicates a match condition.

17. The CAM device of claim 16, wherein the flow select signal alternately selects the first and second flows between successive compare operations.

18. The CAM device of claim 15, wherein the flow select signal selects the first flow for a predetermined number of compare operations.

19. A method of operating a multi-compare content addressable memory (CAM) device, comprising:

simultaneously comparing first and second search keys associated with first and second input flows, respectively, with data stored in an array of the CAM device;

simultaneously generating first and second match results in response to the comparing of the first and second search keys;

selecting the first input flow;

if the first input flow has a match condition, reporting the first match results to a priority encoder; and if the first input flow does not have a match condition, reporting the second match results to the priority encoder.

20. The method of claim 19, wherein the selecting is performed by a flow select logic comprising a plurality of first match inputs to receive the first match results from all of the rows of the array, a plurality of second match inputs to receive the second match results from all of the rows of the array, a control input to receive a flow select signal, and a plurality of outputs coupled to the priority encoder.

21. The method of claim 20, wherein the flow select signal alternates between first and second states to alternately select the first and second input flows for successive compare operations.

22. The method of claim 20, wherein the flow select signal remains in the first state to select the first input flow for a predetermined number of compare operations.

23. The method of claim 19, further comprising:

selecting the second input flow;

if the second input flow has a match condition, reporting the second match results to the priority encoder; and if the second input flow does not have a match condition, reporting the first match results to the priority encoder.

* * * * *